United States Patent [19]

Debus et al.

[11] Patent Number: 4,650,262
[45] Date of Patent: Mar. 17, 1987

[54] SWITCH CABINET BASE

[75] Inventors: Jurgen Debus, Dietzholztal; Jurgen Zachrei, Dillenburg; Helmut Butergerds, Eschenburg, all of Fed. Rep. of Germany

[73] Assignee: Rittal-Werk Rudolf Loh GmbH & Co. KG, Fed. Rep. of Germany

[21] Appl. No.: 719,333

[22] Filed: Apr. 3, 1985

[30] Foreign Application Priority Data

Apr. 3, 1984 [DE] Fed. Rep. of Germany ....... 3412291

[51] Int. Cl.$^4$ .................. A47B 43/00; H02B 1/04; H05K 5/02
[52] U.S. Cl. .................. 312/257 SM; 312/257 SK; 312/257 A; 361/390; 361/429
[58] Field of Search .............. 361/428, 429, 390, 334; 312/257 A, 257 SK, 257 SM; 220/4 R, 4 F, 94 A

[56] References Cited

U.S. PATENT DOCUMENTS

| | | | |
|---|---|---|---|
| 2,424,345 | 7/1947 | West | 361/429 X |
| 3,463,968 | 8/1969 | Olashaw | 361/334 X |
| 4,102,554 | 7/1978 | Reimer | 312/257 SK |
| 4,154,493 | 5/1979 | Prater | 312/257 SK |
| 4,361,369 | 11/1982 | Zwillich | 312/257 SK |

FOREIGN PATENT DOCUMENTS 1435323 5/1965 France .

Primary Examiner—James Kee Chi
Attorney, Agent, or Firm—Thomas W. Speckman

[57] ABSTRACT

This invention relates to a base structure for a switch cabinet having in combination four corner sections, at least two transverse panels and at least two longitudinal panels. The corner sections have two vertical outer walls joined at right angles and the ends of the outer walls are bent inwardly to form mounting flanges provided with mounting holes. The top and bottom of the corner sections have cabinet mounting flanges with mounting holes. Transverse panels and longitudinal panels are screw-fastened to the corner section mounting flanges so their outer surfaces are flush with the outer surfaces of the corner sections. Corner sections, transverse panels and longitudinal panels are adapted to be assembled and disassembled from the interior of the base structure. This base structure configuration ensures that any panel may be removed from bases upon which switch cabinets are mounted in rows of cabinets, and reinstalled without moving the switch cabinets.

15 Claims, 5 Drawing Figures

SWITCH CABINET BASE

BACKGROUND OF THE INVENTION

1. Field of the Invention

The present invention relates to a base structure for a switch cabinet, comprising in combination four corner sections, at least two transverse panels and at least two longitudinal panels assembled to form a base frame, the corner sections comprising two vertical outer walls joined together at right angles and having top and bottom cabinet mounting flanges with mounting holes, the transverse panels and longitudinal panels adapted to be screw-fastened to the corner sections so that their outer surfaces are flush with the outer surface of the corner sections.

2. Description of the Prior Art

A base structure for a switch cabinet provides a surface for mounting a switch cabinet at an elevated level and creates space beneath the switch cabinet for depositing cables used for the particular switch cabinet as well as cables extending from cabinet to cabinet in a succession of adjacent switch cabinets. Switch cabinets frequently comprise a frame with side panels, a top panel and a cabinet door hinged to the frame. The bottom panel is frequently sectionalized and easily detachable from the frame to permit the cables to be introduced into the interior of the cabinet.

In known base structures for switch cabinets, the frame of the switch cabinet is screw fastened to the cabinet mounting flanges of the base corner sections. The narrow side transverse panels and the longitudinal panels are screw-fastened to the corner sections from the outside, the corner sections being provided for this purpose with mounting surfaces recessed from the exterior surfaces by the amount of the thickness of the panels.

This construction of a base, however, has been found inconvenient when a narrow transverse panel needs to be removed from a cabinet in a row of cabinets at a later date. This happens frequently during the course of normal maintenance work or retrofitting and necessary cable adjustments. With conventional bases, the entire row of switch cabinets must either be moved or be separated to reach the transverse panel so it can be removed from the outside.

SUMMARY OF THE INVENTION

It is, therefore, an object of the present invention to provide a base for a switch cabinet of the type generally referred to in the foregoing, wherein the transverse panels and the longitudinal panels of a base structure supporting a single switch cabinet, or a base structure integrated in a row of cabinets, are detachable from the corner sections of the base structure without moving or disrupting the row of cabinets.

This is accomplished according to the present invention in that the vertical edges of outer walls of angular corner sections terminate in rectangularly inwardly bent mounting flanges having a series of mounting holes therein, and that the transverse panels and the longitudinal panels are box-shaped, with side walls of transverse panels and longitudinal panels adjacent mounting flanges of corner sections and provided with corresponding mounting holes.

If the bottom of a switch cabinet mounted on a base having this particular base structure construction is removed, access to the interior space of the base structure and also to the screw connections between corner sections and panels of the base structure is obtained. Thus, each panel may be disassembled from its adjoining corner section from inside the base and eventually removed therefrom. If two switch cabinets installed on bases are side by side, a passage between the two switch cabinets may readily be created by removing the two adjacent transverse panels from the base structures without moving the cabinets. This considerably simplifies any later work, such as refitting or supplementing cables as becomes necessary with switch cabinets integrated in a row of cabinets.

According to one embodiment, the narrow side walls of longitudinal panels are provided at their exposed edges with flanged sections which overlap the adjacent mounting flanges of corner sections and thereby secure the longitudinal panels against turning and permit longitudinal panels to be fixedly secured to the corner sections by a single screw connection.

According to the simplest embodiment, four corner sections, two transverse panels and two longitudinal panels are of the same height and are assembled to form a base structure. This base structure may have the height of a regular base structure. Two identical such base structures may be placed on top of each other and suitably joined to obtain a larger space for cables under the switch cabinet.

According to another embodiment, four corner sections are each twice the height of each of four transverse panels and four longitudinal panels and are assembled to form a base in which the transverse panels are individually removable to create a transitional space. Two transverse panels on one side of the base may also be rotated by 90° and then joined to the corner sections to create a slit-shaped passage. The transverse panels thus displaced may, in addition, be connected to corner sections of an adjacent switch cabinet in a row of cabinets.

Since no cables are introduced from the front of the base structure at the longitudinal front panel, another embodiment provides that each of four corner sections has twice the height of four transverse panels and two longitudinal panels, but the same height as one longitudinal panel, the component parts being assembled into a base structure. The longitudinal panel having the same height as the corner sections forms the front of the base structure.

The corner sections and panels may also comprise a modular set to allow for different base heights and to meet special requirements for passages in the area of the narrow sides of a base, where a base structure set comprises corner sections of one basic height and of twice the basic height, transverse panels having the basic height, and longitudinal panels having the basic height and twice the basic height.

Since switch cabinets differ in width but ordinarily have equal depth, in another embodiment, four longitudinal panels are provided in different lengths to match standard cabinet widths when combined with the corner sections.

According to yet another embodiment, the lower and the upper edges of one of the exterior walls of corner sections terminate in inwardly directed cabinet mounting flanges having mounting holes therein, the cabinet mounting flanges strengthened at their exposed edges by flanged rims directed toward each other, so that the corner sections may be manufactured as identical unitary parts.

To impart sufficient bending resistance or rigidity to the panels, another embodiment provides for the side walls of the transverse panels and the longitudinal panels to be strengthened at their exposed edges by flanged sections directed toward each other.

According to still another embodiment, at least one side wall of the transverse panels is provided with holes for securing additional bars or tracks, cable intercept bars, and the like, by means of brackets.

To obtain the maximum interior space in the base structure, according to another embodiment, the width of the side walls of the transverse panels and of the longitudinal panels corresponds to the width of the adjacent mounting flanges of adjoining corner sections.

According to a further embodiment, the transverse panels are secured to the adjoining panel mounting flanges of the corner sections by means of mounting plates having threaded holes therein, and the mounting plates overlap the panel mounting flange and the side wall of the transverse panel with a flanged edge to prevent the panels from turning. The transverse panels may be secured to the corner sections by a single screw connection.

To create as large a passage as possible in the area of the narrow sides of the base by removing a transverse panel or panels, the outer walls of corner sections adjacent longitudinal panels may be wider than the outer walls of corner sections adjacent transverse panels. Sufficiently supportive mounting surfaces for a switch cabinet on the corner sections are provided when the cabinet mounting flanges on the wider exterior wall of a corner section terminate in angularly flanged portions, and the narrower exterior wall is strengthened by inwardly directed flanged portions, whereby the edges of the cabinet mounting flanges and the edges of the flanged sections are bevelled to form a rectangular supporting surface and simultaneously impart additional strength to the narrower outer surface of the corner section.

The corner sections, the transverse panels and the longitudinal panels are preferably made of metal by bending, stamping or die forming.

BRIEF DESCRIPTION OF THE DRAWINGS

The invention will be described in further detail with reference to a specific embodiment illustrated in the drawings, in which:

FIG. 4 shows a perspective view of the connection between two transverse panels and the corner section of FIG. 2, with the transverse panels having additional mounting capabilities for bars, tracks, cable intercept bars, panels and the like.

DESCRIPTION OF PREFERRED EMBODIMENTS

Figure 1:
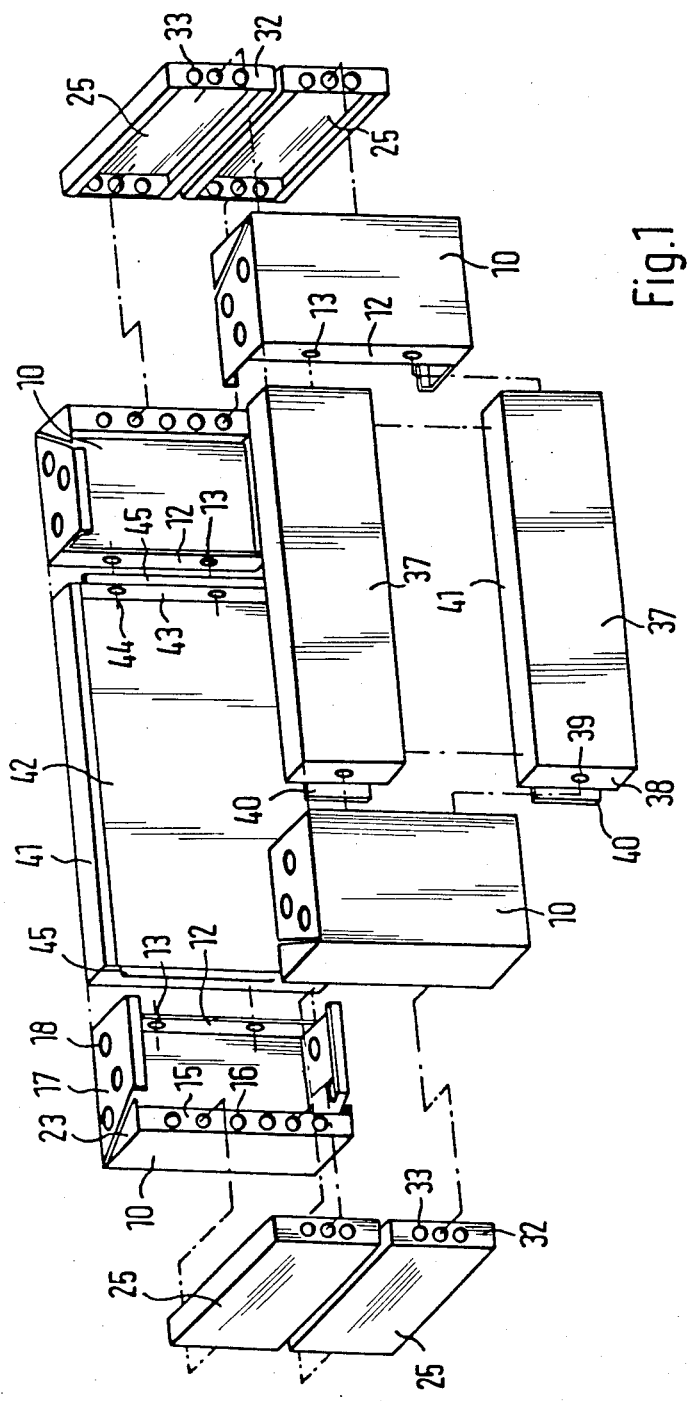
FIG. 1 shows an exploded view of a base comprising four corner sections, four transverse panels and three longitudinal panels, assembled to form a base structure.
Figure 2:
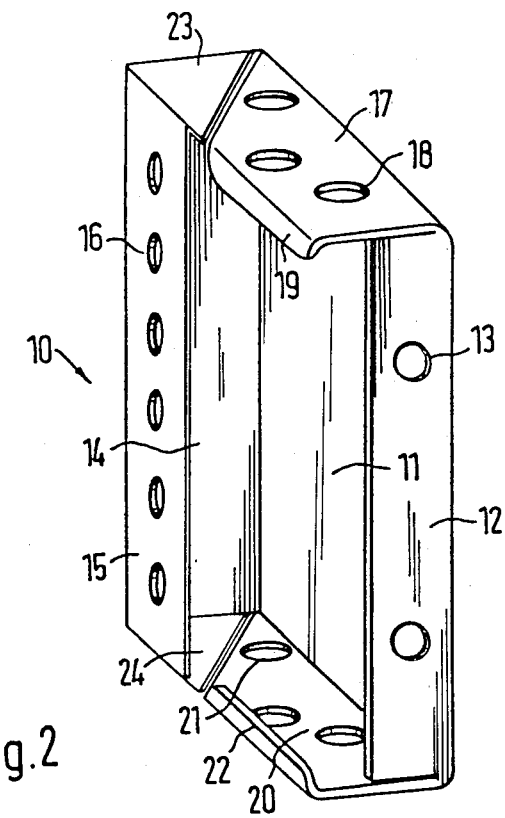
FIG. 2 shows a perspective side view of a corner section of a base structure according to FIG. 1.

The exploded view of FIG. 1 shows the component parts required to construct a base structure according to the present invention. The four corners of the frame-shaped base are defined by four identical corner sections 10 which are simple, one-piece die-formed metal components. The two vertical outer walls 11 and 14 of corner section 10 are at right angles to each other. As shown in the perspective view of FIG. 2, outer wall 11 is substantially wider than outer wall 14. Corner sections 10 are arranged in the base structure so that the wider outer walls 11 are aligned with the longitudinal sides of the base structure and the narrower outer walls 14 are aligned with the transverse sides of the base structure, as shown in FIG. 1.

Oppositely directed vertical edges of outer walls 11 and 14 are bent inwardly to form mounting flanges 12 and 15 provided with mounting holes 13 and 16, respectively. The bottom edge and top edge of outer wall 11 are likewise bent inwardly to form cabinet mounting flanges 20 and 17 having mounting holes 21 and 18, respectively. The inner edges of cabinet mounting flanges 17 and 20 terminate in flanged sections 19 and 22 directed toward each other. In the corner area where outer walls 11 and 14 meet, cabinet mounting flanges 17 and 20 are bevelled to complement the similarly bevelled edges of the flanged top and bottom sections 23 and 24 of narrower outer wall 14 to form rectangular supporting surfaces for the switch cabinet. Upper flanges 17 of each of four corner sections 10 are the preferred mounting sites for a switch cabinet to be screw-fastened to the base structure.

Figure 3:
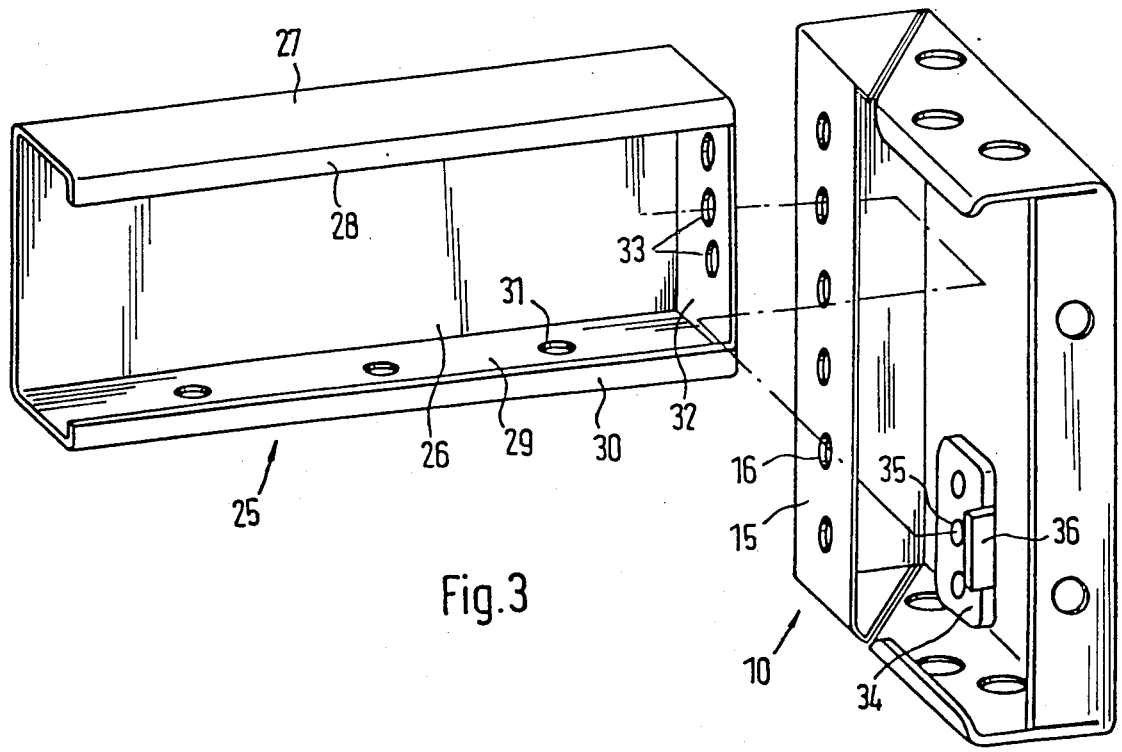
FIG. 3 shows an exploded perspective view of the connection between a transverse panel and the corner section of FIG. 2.

The two narrower sides of the base structure are formed by identical transverse panels 25 having a height of only about one-half the height of corner section 10. As shown in FIG. 3, transverse panels 25 are also die-formed metal parts. Outer wall 26 is strengthened by two longitudinal side walls 27 and 29. End walls 32 are provided with a series of three mounting holes 33 which align with a series of six mounting holes 16 in panel mounting flange 15. A connection is formed by a mounting bolt extending through hole 33 in wall 32 of transverse panel 25 and through hole 16 in panel mounting flange 15, the bolt threadedly inserted into an internally threaded hole 35 provided in mounting plate 34. Mounting plate 34 is mounted to the inner side of panel mounting flange 15 and overlaps the exposed edges of panel mounting flange 15 and end wall 32 of transverse panel 25 with a flanged section 36, with the result that transverse panel 25 is firmly affixed to corner sections 10 and secured against rotational displacement, simply by using one mounting bolt. The width of end wall 32 corresponds to the width of panel mounting flange 15.

Figure 4:
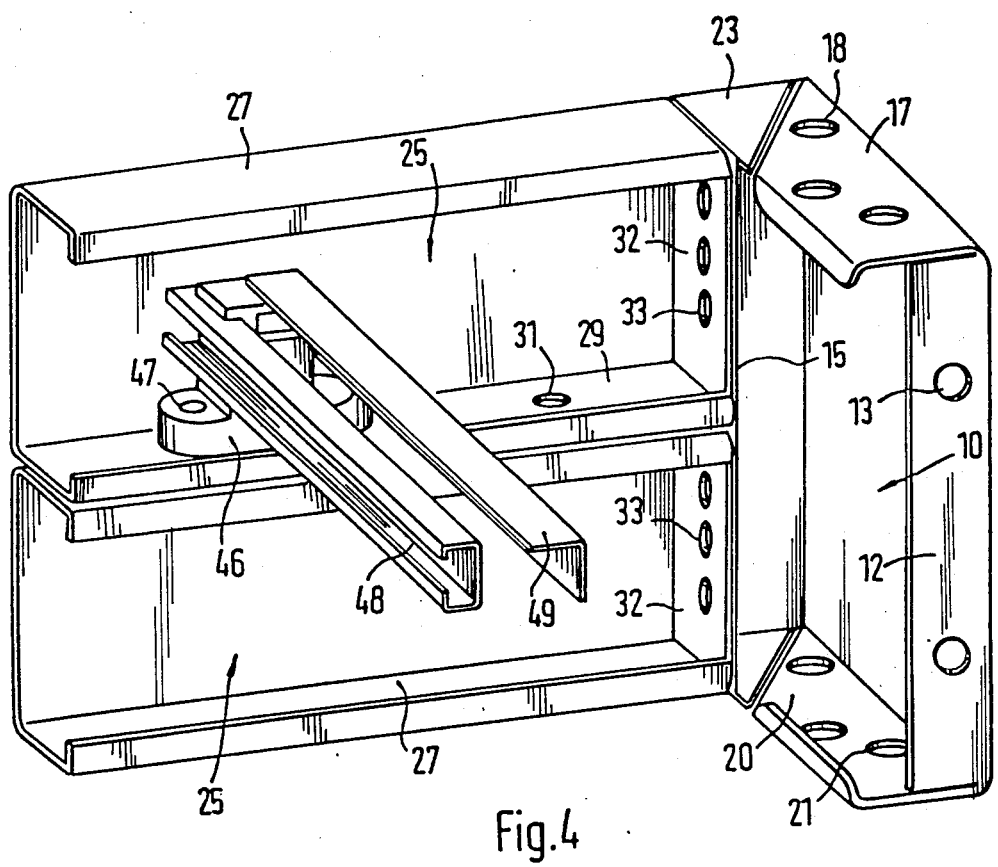

The narrower sides of the base structure may be formed by two identical transverse panels 25 placed on top of one another. In this embodiment, longitudinal side walls 29 of two transverse panels 25 are superimposed and the end walls 32 are screw-fastened to corner sections 10. Additional storage capabilities may be provided with the aid of brackets 46 mounted by flanges 47 to longitudinal side walls 29, as shown in FIG. 4. Bracket 46 may support DIN standard bars 48, cable intercept bars 49, and the like, extending parallel to the longitudinal sides of the base structure.

The longitudinal sides of the base structure may be defined, first, by longitudinal panels 37 and, second, by longitudinal panels 42. Longitudinal side walls 41 of longitudinal panels 37 and 42 are bent and strengthened along their edges similarly to longitudinal side walls 27 and 29 of transverse panels 25, described above. Mounting holes 39 and 44 in end walls 38 and 43 of longitudinal panel 37 and 42 are arranged to align with mounting holes 13 in panel mounting flange 12 of corner sections 10. The width of panel mounting flange 12 corresponds to the width of end walls 38 and 43 of longitudinal panels 37 and 42. End walls 38 and 43 may be screw-fastened directly to panel mounting flanges 12 of corner sections 10. These screw connections are accessible from the interior of the base structure. Removing the bottom of the switch cabinet mounted on the base structure by screw connection provides access to the interior of the base structure and thus to all mounting screws, thereby providing access to detach any individual transverse panel 25 or longitudinal panel 37 and 42 from their adjoining corner sections 10.

As shown in FIG. 1, the exposed edges of end walls 38 and 43 of longitudinal panels 37 and 42 terminate in outwardly extending flanged portions 40 and 45 which overlap the exposed edges of panel mounting flanges 12 so that panels 37 and 42 are affixed to corner sections 10 and are secured against rotational displacement, all by a single screw connection. Consequently, only one mounting hole 39 in end wall 38 of longitudinal panel 37 is needed, while the larger longitudinal panel 42 has two mounting holes 44 in its end wall 43.

From FIG. 1 it will be understood that a structural module set for making switch cabinet bases of different heights may comprise components of different heights. Using transverse panels 25 and longitudinal panels 37 of a uniform basic height, in combination with corner sections of the same basic height, produces a base which may be employed as a regular upright stand for a switch cabinet. Using corner sections 10 having a height twice the basic height, two transverse panels 25 of basic height are required to form a narrow side of the base structure. The longitudinal sides of the base may be formed by two longitudinal panels 37 of the basic height, or by one longitudinal panel 42 of twice the basic height. Since there are switch cabinets of various widths, the longitudinal panels 37 and 42 may be manufactured in various lengths to match individual cabinet widths, allowance being made for the width of outer walls 11 of corner sections 10.

Figure 5:
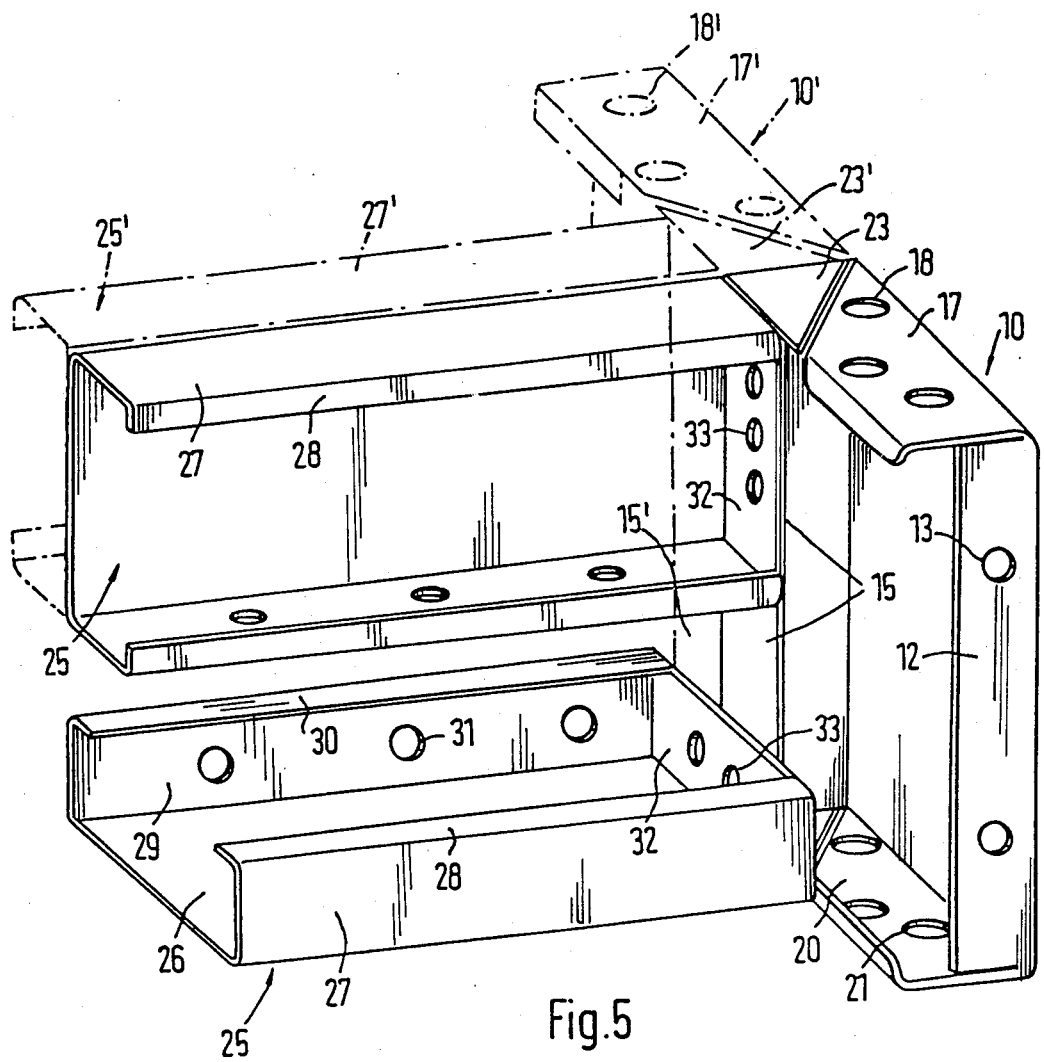
FIG. 5 shows a perspective view illustrating schematically the formation of a passage between adjacent switch cabinets on two adjacent base structures.

As shown in FIG. 5, a base structure in which the two narrow sides each comprise two transverse panels 25 is a good example of how a passage space leading to an adjacent switch cabinet may easily be produced by incorporating the base structure of an adjacent switch cabinet. Since the screw connections are easily accessible from the interior of the base structure, lower transverse panel 25, for example, may be unscrewed from a single base supporting a single cabinet in a row of cabinets, may be rotated 90° and reinstalled horizontally. Outer wall 26, in combination with cabinet mounting flange 20 of corner sections 10, will then enlarge the support area of the base while a long slit-like opening is provided above the horizontally positioned panel 25 as a passage between two adjacent bases, as indicated by corner section 10' and upper transverse panel 25' of the adjacent switch cabinet. End walls 32 of transverse panel 25 in the horizontal position are screw-fastened to the two panel mounting flanges 15 and 15' of corner sections 10 and 10' to securely connect the adjacent bases to each other. Longitudinal side wall 29 of transverse panel 25 may accommodate standardized (DIN) bars, cable intercept bars, cable conduits, cable sealings, and the like. If the passage area is too small, upper transverse panels 25 and 25' may be detached likewise without moving or changing the switch cabinets mounted on the base structures. As indicated by side walls 27', cabinet mounting flange 17' having cabinet mounting holes 18' therein, and bevelled top section 23', the adjacent base structure has the same supporting surface and mounting capabilities.

Similarly, longitudinal panel 37 may be detached from its respective corner sections 10 when cables must be introduced to a particular longitudinal side in back of the base structure, for example. Longitudinal panel 37 may be taken off from inside the base structure and then removed therefrom. Longitudinal panel 42, which extends the entire height of the base structure, may be installed in the front of the switch cabinet, since no cables are introduced from this side. However, two longitudinal panels 37 may be used for the front longitudinal side of the base structure. Instead of corner sections 10 having a height twice the basic height, two corner sections 10 of basic height may be screwed together to form a corner section of twice the basic height. In any event, all screw connections for the assembled base structure are accessible from the interior of the base structure, and each panel is accessible from inside the base for dismounting and removal, when necessary.

We claim:

1. Base structure for a switch cabinet enclosing an interior space, comprising four angular corner sections (10), at least two transverse panels (25) and at least two longitudinal panels (37, 42) assembled to form said base structure, each said corner section (10) attached to at least one said transverse panel (25) and at least one said longitudinal panel (37, 42), wherein each said corner section (10) comprises a first and a second vertical outer wall (11, 14), respectively, meeting at right angles, each said corner section (10) having top and bottom cabinet mounting flanges (17, 20), respectively, said cabinet mounting flanges (17, 20) oriented at right angles to said corner section outer walls (11, 14), directed toward said interior space, and provided with mounting holes (18, 21), respectively; said transverse panels (25) and said longitudinal panels (37, 42) are fastened to said corner sections (10) so that the outer surfaces of said transverse (25) and longitudinal panels (37, 42) are flush with the outer surfaces of said corner section outer walls (11, 14); terminal vertical edges of said first and second outer walls (11, 14) of said corner sections (10) terminate in first and second panel mounting flanges (12, 15), oriented at right angles to said corner section outer walls (11, 14), directed toward said interior space, and provided with mounting holes (13, 16), respectively; said transverse panels (25) and said longitudinal panels (37, 42) having end walls (32, 38, 43), respectively, joined to said panel mounting flanges (12, 15) of said corner sections (10) and provided with mounting holes (33, 39, 44), respectively, corresponding to said mounting holes (13, 16) in said panel mounting flanges, (12, 15); said end walls (38, 43) of said longitudinal panels (37, 42) are provided at their terminal edges with flange sections (40, 45), respectively, which overlay said first panel mounting flanges (12) of said corner sections (10) to prevent said longitudinal panels (37, 42) from undergoing rotational displacement, and mounting plates (34) are provided with internally threaded holes (35) for attachment of said mounting plates (34) to said second panel mounting flange (15), each said mounting plate (34) having a flange portion (36) which overlays said panel mounting flange (15) and said end wall (32) of an adjacent said transverse panel (25) joined to said second panel mounting flange (15) to prevent said transverse panels from undergoing rotational displacement.

2. Base according to claim 1, comprising four said corner sections (10), two said transverse panels (25) and two said longitudinal panels (37), said corner sections (10), said transverse panels (25) and said longitudinal panels (37) of equal height.

3. Base according to claim 1, comprising four said corner sections (10), four said transverse panels (25) and four said longitudinal panels (37), each said corner section (10) extending twice the height of said transverse panels (25) and said longitudinal panels (37).

4. Base according to claim 1, comprising four said corner sections (10), four said transverse panels (25), and three said longitudinal panels (37, 42), each said corner section (10) extending twice the height of each said transverse panel (25) and two said longitudinal panels (37), and extending the same height as one said longitudinal panel (42).

5. Base according to claim 1, characterized in that said longitudinal panels (37, 42), in combination with said corner sections (10), are of lengths to accommodate standard switch cabinet widths.

6. Base according to claim 1, characterized in that said cabinet mounting flanges (17, 20) extend from said first corner section outer walls (11), and that said cabinet mounting flanges (17, 20), are reinforced at their terminal edges by flange sections (19, 22), oriented at right angles to said cabinet mounting flanges (17, 20) and directed toward said interior space.

7. Base according to claim 6, characterized in that each said second corner section outer wall (14) is reinforced by flange sections (23, 24) oriented at right angles to said second corner section outer wall (14), with adjacent edges of said cabinet mounting flanges (17, 20) and said second corner section outer wall flange sections (23, 24) correspondingly bevelled to provide a rectangular top and bottom supporting surface.

8. Base according to claim 7, characterized in that said transverse panels (25) and said longitudinal panels (37, 42) have longitudinal side walls (27, 29, 41), respectively, extending at right angles from said transverse (25) and longitudinal panels (37, 42) and directed toward said interior space, and said longitudinal side walls (27, 29, 41) are reinforced at their terminal edges by flange sections (28, 30) oriented at right angles to said longitudinal side walls (27, 29, 41), and directed toward each other.

9. Base according to claim 8, characterized in that at least one said longitudinal side wall (29) of said transverse panels (25) has mounting holes (31).

10. Base according to claim 8, characterized in that the width of said longitudinal side walls (27, 29, 41) of said transverse panels (25) and said longitudinal panels (37, 42) corresponds to the width of said first and second panel mounting flanges (12, 15) of said corner sections (10).

11. Base according to claim 1, characterized in that said first outer walls (11) of said corner sections (10) adjacent said longitudinal panels (37, 42) are wider than said second outer walls (14) of said corner sections (10) adjacent said transverse panels (25).

12. Base according to claim 1, characterized in that said corner sections (10), said transverse panels (25) and said longitudinal panels (37, 42) comprise metal formed by die shaping.

13. Base according to claim 1, characterized in that said transverse panels (25) and said longitudinal panels (37, 42) have longitudinal side walls (27, 29, 41), respectively, extending at right angles from said transverse (25) and longitudinal panels (37, 42) and directed toward said interior space, and said longitudinal side walls (27, 29, 41) are reinforced at their terminal edges by flange sections (28, 30) oriented at right angles to said longitudinal side walls (27, 29, 41), and directed toward each other.

14. Base according to claim 7, characterized in that said first outer walls (11) of said corner sections (10) adjacent said longitudinal panels (37, 42) are wider than said second outer walls (14) of said corner sections (10) adjacent said transverse panels (25).

15. Base according to claim 7, characterized in that said corner sections (10), said transverse panels (25) and said longitudinal panels (37, 42) comprise metal formed by die shaping.

* * * * *